United States Patent
Kanda et al.

(10) Patent No.: US 10,390,431 B2
(45) Date of Patent: Aug. 20, 2019

(54) FLEXIBLE PRINTED CIRCUIT BOARD HAVING SLIT

(71) Applicant: FUJITSU COMPONENT LIMITED, Tokyo (JP)

(72) Inventors: Mitsuki Kanda, Tokyo (JP); Takatoshi Yagisawa, Tokyo (JP); Osamu Daikuhara, Tokyo (JP); Hideo Miyazawa, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 0 days.

(21) Appl. No.: 16/133,820

(22) Filed: Sep. 18, 2018

(65) Prior Publication Data

US 2019/0098757 A1     Mar. 28, 2019

(30) Foreign Application Priority Data

Sep. 28, 2017  (JP) ................................ 2017-188250

(51) Int. Cl.
*H05K 1/11*      (2006.01)
*H05K 1/02*      (2006.01)
*H01R 12/77*     (2011.01)

(52) U.S. Cl.
CPC ........... *H05K 1/117* (2013.01); *H05K 1/0281* (2013.01); *H05K 1/118* (2013.01); *H01R 12/778* (2013.01); *H05K 2201/09172* (2013.01)

(58) Field of Classification Search
CPC ...... H01K 1/117; H05K 1/0281; H05K 1/118; H05K 2201/09172; H01R 12/778
USPC ........................................................... 174/254
See application file for complete search history.

(56) References Cited

U.S. PATENT DOCUMENTS

| | | | | |
|---|---|---|---|---|
| 6,129,555 | A  * | 10/2000 | Daikuhara | H05K 1/0219 439/60 |
| 8,083,526 | B2 * | 12/2011 | Long | H01R 13/6585 439/60 |
| 2010/0304614 | A1 * | 12/2010 | Matsuo | H01R 12/62 439/629 |
| 2014/0141629 | A1 * | 5/2014 | Yagisawa | H05K 1/0277 439/77 |
| 2014/0193986 | A1 * | 7/2014 | Venaleck | H05K 1/0256 439/67 |
| 2016/0374200 | A1 * | 12/2016 | Lee | H05K 1/118 |

FOREIGN PATENT DOCUMENTS

JP     2002-094203     3/2002

* cited by examiner

*Primary Examiner* — Andargie M Aychillhum
*Assistant Examiner* — Michael F McAllister
(74) *Attorney, Agent, or Firm* — IPUSA, PLLC

(57) ABSTRACT

A flexible printed circuit board for coupling to a connector having a plurality of contacts includes a flexible film, a plurality of electrodes disposed on at least one face of the film and configured to come in contact with the contacts of the connector, and one or more slits formed in the film between adjacent electrodes among the plurality of electrodes.

5 Claims, 8 Drawing Sheets 510  530 540 550 520

510   530 540 550 520

510  530 540 550  520

520 550 510 530 543 544 545 546 547 548
540

FLEXIBLE PRINTED CIRCUIT BOARD HAVING SLIT

BACKGROUND OF THE INVENTION

1. Field of the Invention

The disclosures herein relate to a flexible printed circuit board.

2. Description of the Related Art

A flexible printed circuit board (hereinafter referred to as an FPC) is used for connection between substrates such as IC package substrates. An FPC is connected to a substrate through an FPC connector attached to the substrate (see Patent Document 1, for example). The FPC connector has upper and lower connection parts. The FPC is clamped between the upper and lower connection parts.

An FPC is flexible and deformable by an external force. The thickness of an FPC card edge which is connected to a connector may be uneven. Due to such unevenness, the card edge may deform inside the connector upon being pressed by contacts, which creates a risk of contact failure. Further, the height of contacts of the connector may be uneven. An FPC may not be sufficiently flexible to conform to the differences between the contacts, which creates a risk of contact failure.

Accordingly, there may be a need for a flexible printed circuit board that provides reliable connection with a connector.

RELATED-ART DOCUMENTS

Patent Document

[Patent Document 1] Japanese Patent Application Publication No. 2002-094203

SUMMARY OF THE INVENTION

It is a general object of the present invention to provide a flexible printed circuit board that substantially obviates one or more problems caused by the limitations and disadvantages of the related art.

According to an embodiment, a flexible printed circuit board for coupling to a connector having a plurality of contacts includes a flexible film, a plurality of electrodes disposed on at least one face of the film and configured to come in contact with the contacts of the connector, and one or more slits formed in the film between adjacent electrodes among the plurality of electrodes.

According to at least one embodiment, a flexible printed circuit board provides reliable connection with a connector.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments will be described by referring to the accompanying drawings. In these drawings, the same elements are referred to by the same references, and a description thereof may be omitted.

A flexible printed circuit board (FPC) of the present embodiments offers superior flexibility, and may be used as 3-dimensional interconnections or as interconnections for movable parts repeatedly subject to bending. The FPC may be used for connection between substrates such as IC package substrates. The FPC is connected to a substrate through a connector attached to the substrate.

Figure 1A:
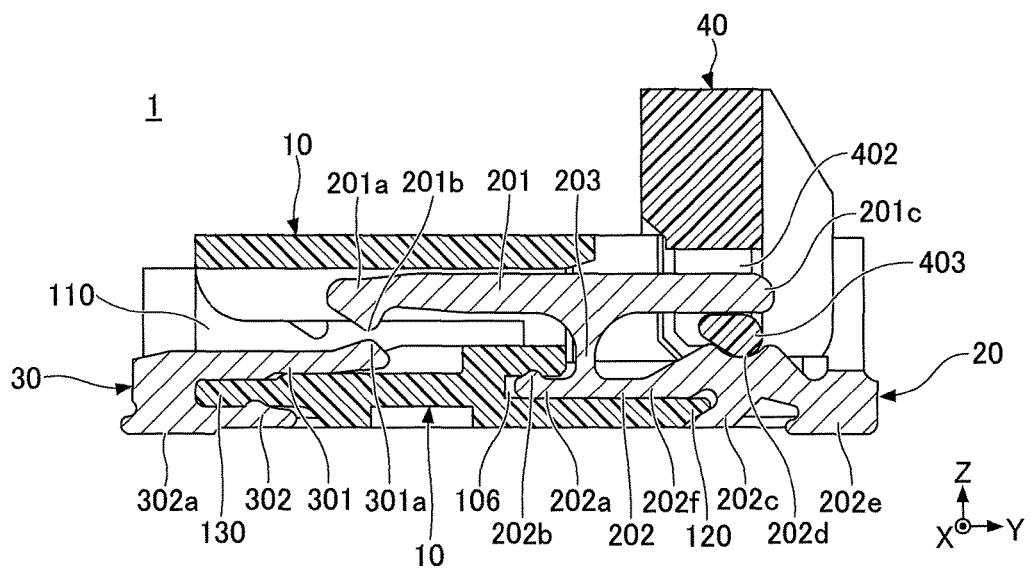
FIGS. 1A and 1B are schematic cross-sectional views illustrating a connector into which an FPC is inserted.
Figure 1B:
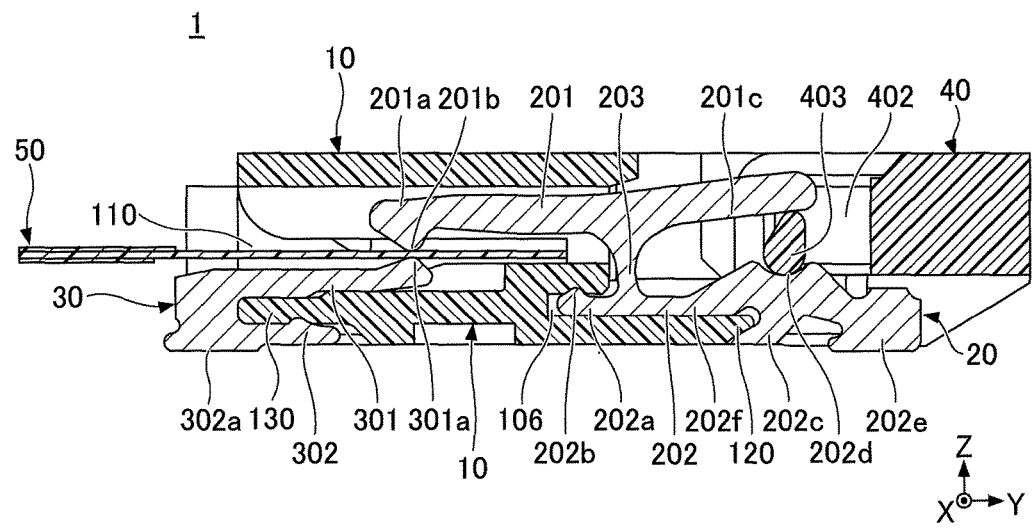

In the following, a connector into which an FPC is inserted will be described. FIGS. 1A and 1B are schematic cross-sectional views illustrating a connector into which an FPC is inserted. FIG. 1A illustrates a connector without an inserted FPC, and FIG. 1B illustrates the connector into which an FPC is inserted. In these and subsequent drawings, the X direction refers to the width direction of a connector 1 (the transverse direction of an FPC 50), and the Y direction refers to the direction of the FPC insertion path of the connector 1 (the longitudinal direction of the FPC 50), with the Z direction referring to the height direction of the connector 1.

As illustrated in FIG. 1A and FIG. 1B, the connector 1 includes a housing 10, a first contact 20, a second contact 30, and an actuator 40. The connector 1 is fixedly attached to a substrate through soldering provided at the lower surface of the housing 10. The connector 1 serves to couple the FPC 50 to the substrate.

The housing 10 has a receptacle opening 110 into which the FPC 50 is inserted. The actuator 40 is rotatably supported on the housing 10. The actuator 40 having a cam 403 is rotated into a horizontal position as illustrated in FIG. 1B to press the first contact 20 against the FPC 50 inserted into the housing 10.

The first contact 20 includes a movable contact 201, a fixed contact 202, and a connection part 203. The first contact 20 is made by punching from a thin plate of a conductive metal material.

The movable contact 201 extends in the Y direction, and has, at a tip 201*a* toward the mouth of the receptacle opening 110, a contact projection 201*b* coming in contact with the upper surface of the FPC 50. The movable contact 201 is connected to the fixed contact 202 through the connection part 203 extending in the Z direction. The cam 403 is sandwiched between the fixed contact 202 and a rear part 201*c* of the movable contact 201.

The fixed contact 202 includes a first fixed part 202*a*, a tab 202*b*, a second fixed part 202*c*, a cam recess 202*d*, a substrate contact part 202*e*, and a main part 202*f*. The fixed contact 202 is fixedly mounted to the housing 10 and comes in contact with the substrate.

The connection part 203 connects the movable contact 201 and the fixed contact 202. The connection part 203 flexibly deforms and provides support for the first contact 20 which swings in response to the motion of the actuator 40.

As the actuator 40 is rotated from the state illustrated in FIG. 1A to the state illustrated in FIG. 1B, the cam 403 presses the rear part 201c upward, causing the movable contact to swing around the flexibly deformable connection part 203, resulting in the contact projection 201b to be pressed against the upper surface of the FPC 50.

The first fixed part 202a projects, from the point of connection to the connection part 203, toward the receptacle opening 110 to be engaged with an engagement hole 106 of the housing 10, thereby securing the fixed contact 202 to the housing 10. The first fixed part 202a has the tab 202b projecting upward from the tip thereof. The thickness of the first fixed part 202a at the position of the tab 202b in the Z direction is greater than the height of the engagement hole 106. The first fixed part 202a is thus pressed into the engagement hole 106, and is secured to the housing 10 through the engagement of the tab 202b with the engagement hole 106, which prevents disconnection from the engagement hole 106.

The second fixed part 202c, which projects toward the substrate from the main part 202f extending in the Y direction along the housing 10, is engaged with a first end 120 of the housing 10 situated opposite the receptacle opening 110. The first end 120 is sandwiched between the second fixed part 202c and the main part 202f so that the second fixed part 202c is fixedly attached to the housing 10.

The cam recess 202d is formed in the upper face of the fixed contact 202, such that the cam 403 is sandwiched between the cam recess 202d and the rear part 201c. The cam recess 202d is an arc shape conforming to the outline of the cam 403.

The substrate contact 202e, which is situated opposite the receptacle opening 110 of the housing 10, has a lower face that is exposed from the housing 10 to come in contact with a terminal of the substrate.

The second contact 30 includes an FPC contact 301 and a substrate contact 302. The FPC contact 301 and the substrate contact 302 clamp a second end 130 of the housing 10 therebetween, so that the second contact 30 is fixedly attached to the housing 10. The second contact 30 is made by punching from a thin plate of a conductive metal material.

A portion of the FPC contact 301 facing the tip 201a has an upwardly bulging shape to form a contact projection 301a, which comes in contact with the lower surface of the FPC 50.

The substrate contact 302 has a lower face 302a exposed from the housing 10 to come in contact with a terminal of the substrate.

The cam 403 has a generally ellipse cross-sectional shape in the Y-Z plane. As the actuator 40 is rotated into a horizontal position as illustrated in FIG. 1B, the cam 403 presses the rear part 201c upward.

Rotating the actuator 40 as illustrated in FIG. 1B causes the FPC 50 to be clamped between the contact projection 201b and the contact projection 301a. With this arrangement, the FPC 50 is coupled to the substrate.

<First Embodiment>

In the following, a flexible printed circuit board of a first embodiment will be described.

Figure 2A:
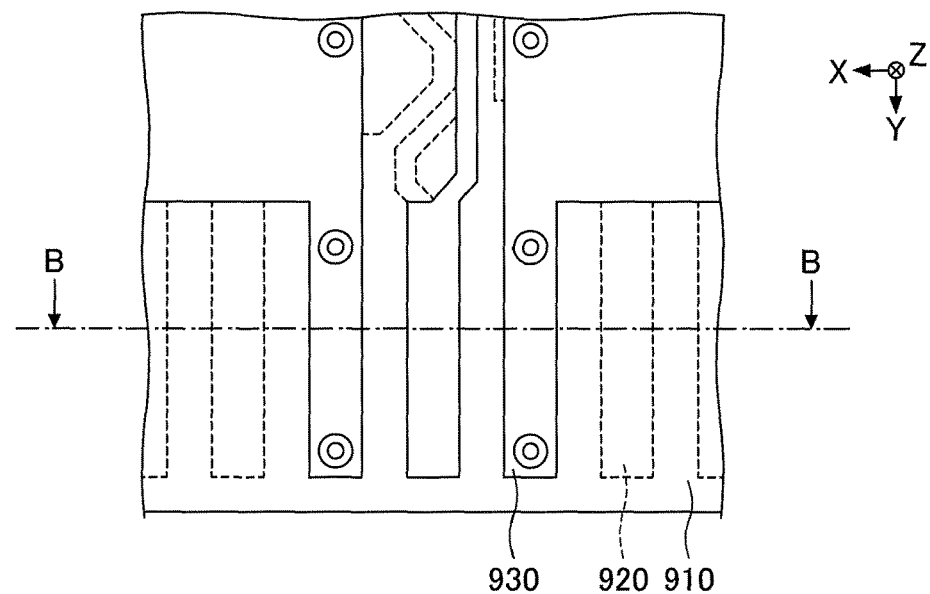
FIGS. 2A through 2C are drawings illustrating a flexible printed circuit board.
Figure 2B:
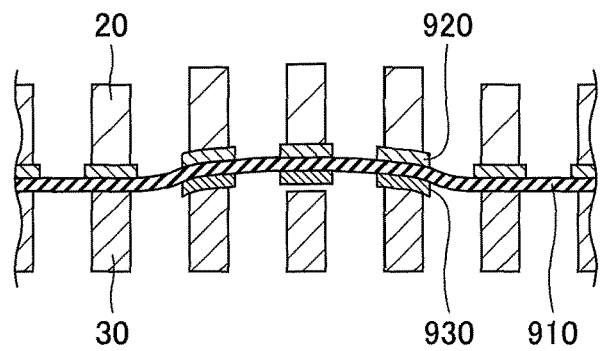
Figure 2C:
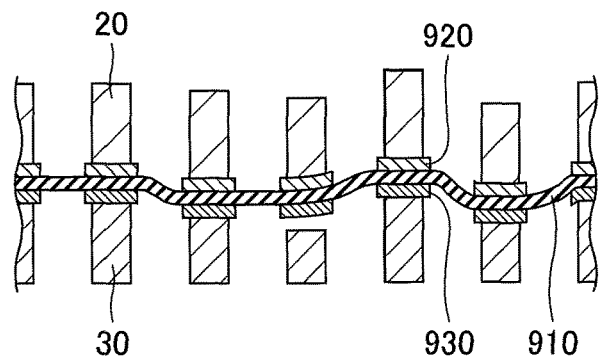

FIGS. 2A through 2C are drawings illustrating an FPC. FIG. 2A is a plan view illustrating the back face of a card edge. FIG. 2B and FIG. 2C are cross-sectional views taken along the dash and dot line B-B in FIG. 2A, and illustrate the FPC sandwiched between the upper and lower contacts.

As illustrated in FIG. 2A, the FPC includes an insulating film 910, front face electrodes 920, and back face electrodes 930. The film 910 is a flexible film made of an insulating material. The front face electrodes 920 are formed on the front face of the film 910 at a tip. The back face electrodes 930 are formed on the back face of the film 910 at the tip. In the FPC illustrated in FIGS. 2A through 2C, the front face electrodes 920 and the back face electrodes 930 are brought in contact with the respective first contacts 20 and the respective second contacts 30 of the connector 1, respectively.

The card edge of the FPC has electrodes on both the front face and the back face of the film 910 at some positions, and has electrodes only on the front face of the film 910 at other positions, as illustrated in FIG. 2B. In such a case, the thickness of the film 910 at the positions where electrodes are disposed on both the front face and the back face differs from the thickness of the film 910 at the positions where electrodes are disposed only on the front face. With such an uneven thickness, coupling the card edge to the connector 1 may cause the card edge to be deformed inside the connector 1, depending on the way in which pressure is applied by the first contacts 20 and the second contacts 30. When the card edge is partially deformed, there may be a risk that the back face electrodes 930 fail to be in contact with the second contacts 30 (the second contact 30 situated at the center illustrated in FIG. 2B).

Further, as illustrated in FIG. 2C, the height of the second contacts 30 may be uneven. When the deformation of the FPC is not sufficient, the FPC 50 fails to conform to the differences in height between the second contacts 30. Accordingly, there is a risk that some of the second contacts 30 fail to come in contact with the back face electrodes 930.

Figure 3A:
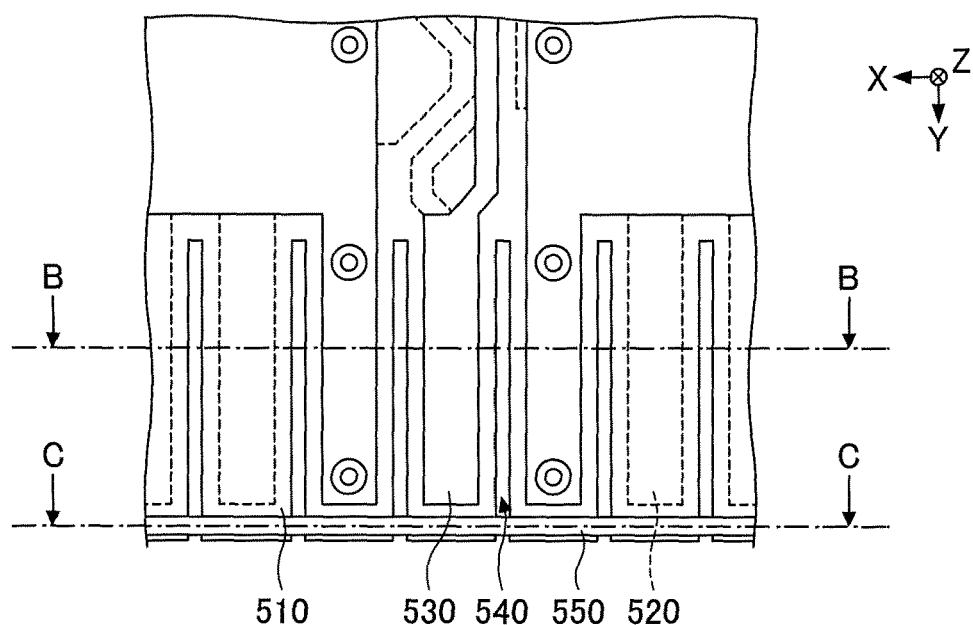
FIGS. 3A through 3C are drawings illustrating a flexible printed circuit board of a first embodiment.
Figure 3B:
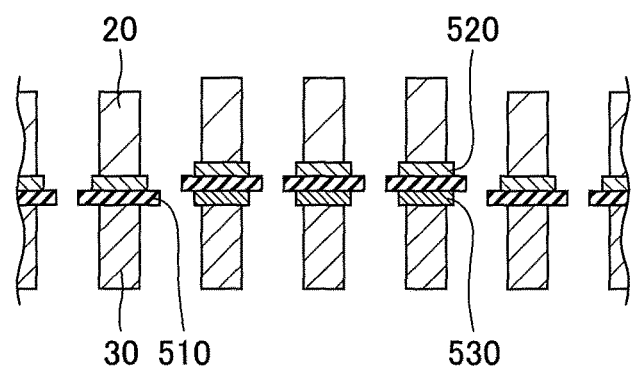
Figure 3C:
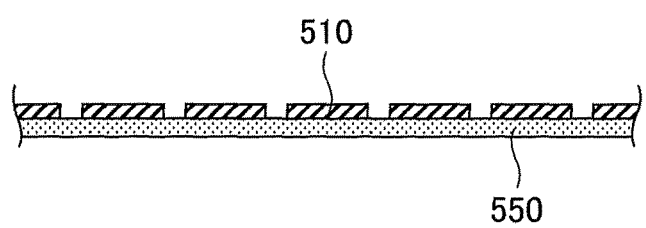

In the following, an FPC of the present embodiment will be described. FIGS. 3A through 3C are drawings illustrating the FPC of the first embodiment. FIG. 3A is a plan view illustrating the back face of the card edge of the FPC. FIG. 3B and FIG. 3C are cross-sectional views taken along the dash and dot line B-B and the dash and dot line C-C, respectively, in FIG. 2A, and illustrate the FPC sandwiched between the upper and lower contacts.

As illustrated in FIG. 3A, the FPC includes an insulating film 510, a plurality of front face electrodes 520, a plurality of back face electrodes 530, slits 540, and a reinforcement plate 550.

The film 510 is a flexible film made of an insulating material such as polyimide, polyethylene terephthalate, or the like. The thickness of the film 510 is 10 to 100 micrometers, for example.

The front face electrodes 520 are formed on the front face of the film 510 at a tip. The front face electrodes 520, which are connectable to the first contacts 20 of the connector, are disposed at intervals equal to the intervals of the first contacts 20. The intervals of the first contacts 20 are 0.35 millimeters, for example. The front face electrodes 520 are made of a conductive film. The conductive film may be implemented as a copper foil, the thickness of which may be 15 to 20 micrometers, for example.

The back face electrodes 530 are formed on the back face of the film 510 at the tip. The back face electrodes 530 which are connectable to the second contacts 30 are disposed at intervals equal to the intervals of the second contacts 30. The intervals, material, and thickness of the back face electrodes 530 are the same as or similar to the front face electrodes 520.

Figure 4:
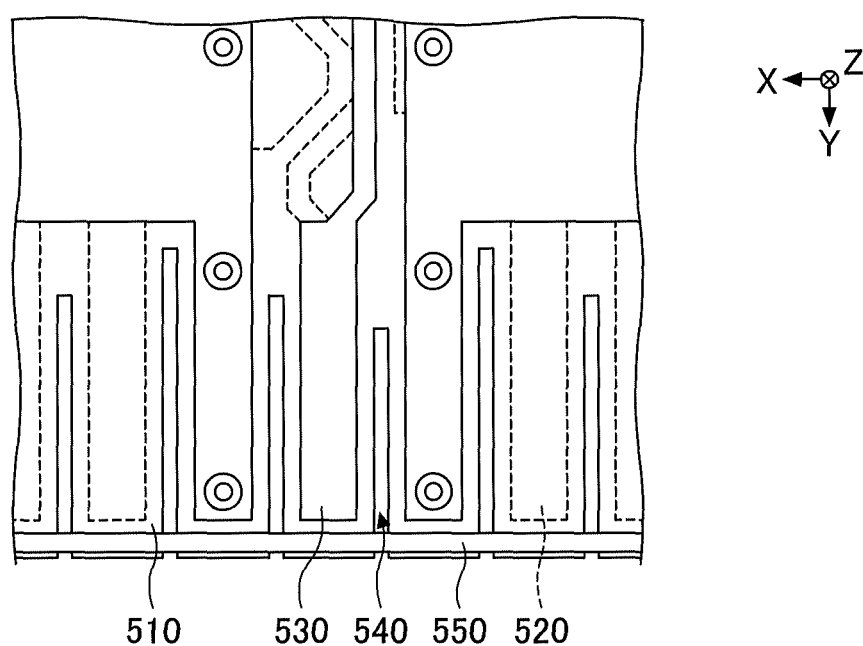
FIG. 4 is a drawing illustrating a variation of the flexible printed circuit board of the first embodiment.

The slits 540 are cuts made into the film 510 at the positions between adjacent electrodes. The slits 540 may be formed at the same 0.35-millimeter intervals as the intervals of the back face electrodes 530. Each of the slits 540 has a predetermined width, and is a rectangular shape whose long side extends from the tip edge of the film 510 in the longitudinal direction. It suffices for the width to be smaller than or equal to the distance between adjacent electrodes. The width may be 0.1 millimeters, for example. The slits 540 may have the same length, or may have different lengths as illustrated in FIG. 4. FIG. 4 is a drawing illustrating a variation of the FPC of the first embodiment.

As described above, the slits 540 formed into the film 510 between electrodes improves the movability of electrodes, and allows the individual electrodes to be moved independently of each other. With this arrangement, the individual electrodes at the card edge are able to conform to the first contacts 20 and the second contacts 30 even when the thickness of the card edge is uneven or even when the heights of the second contacts 30 are uneven. The electrodes and the contacts are thus reliably brought into contact with each other.

The reinforcement plate 550 is disposed further toward the tip edge of the film 510 than the front face electrodes 520 and the back face electrodes 530 in such as manner as to extend across the slits 540 on the back face of the film 510.

The reinforcement plate 550 is a flexible film of a conductive material or an insulating material such as polyimide, an epoxy-based resin, or ceramics.

In the case of polyimide being used, the reinforcement plate 550 may be made by bonding a polyimide tape to the film 510, or may be made by using adhesive to attach a polyimide film to the film 510. Ceramics used herein may include silicon carbide, alumina, and zirconia, for example. The conductive material may be a metal material such as iron or copper, for example. When a conductive material is used to form the reinforcement plate 550, there is a need to ensure that the reinforcement plate 550 does not come in contact with the electrodes. When an insulating material is used to form the reinforcement plate 550, the reinforcement plate 550 may come in contact with the first contacts 20 and the second contacts 30, thereby preventing the first contacts 20 and the second contacts 30 from being in contact with the electrodes. In order to avoid this, the short side of the reinforcement plate 550 is made shorter than the distance between the tip edge of the film 510 and the position at which the electrodes come in contact with the first contacts 20 and the second contacts 30.

The thickness of the reinforcement plate 550 is preferably smaller than the length of the short side of the reinforcement plate 550 to ensure sufficient adhesion with the film 510. It may be noted, however, that the reinforcement plate 550 may be thicker than the film constituting the FPC, and may be 100 micrometers, for example. The provision of the reinforcement plate 550 situated further toward the tip edge of the film 510 than the front face electrodes 520 and the back face electrodes 530 and extending across the slits 540 on the back face of the film 510 ensures that the predetermined intervals be maintained between the electrodes despite the slits 540 reaching the tip edge of the film 510. This arrangement prevents the electrodes from being displaced sideways when the card edge is inserted into the connector 1, and accidental contact between the electrodes is thus prevented.

Further, placing the reinforcement plate 550 toward the tip edge of the film 510 than the electrodes ensures that the electrodes are not directly connected to each other through the reinforcement plate 550. With this arrangement, the electrodes have greater movability than the tip edges of the film 510, and, thus, are able to conform to the first contacts 20 and the second contacts 30 when the electrodes are sandwiched between the first contacts 20 and the second contacts 30. Accordingly, the electrodes reliably come in contact with the first contacts 20 and the second contacts 30. This improves the reliability of connection between the connector and the FPC.

The reinforcement plate 550 is preferably made of a material having a tensile strength of 200 N/mm$^2$ or more from the perspective of providing sufficient strength against tension occurring at the time of insertion or removal of the card edge into or from the connector. The tensile strength is measured by a method complying with JISZ2241.

The reinforcement plate 550 is preferably made of a material having a flexural strength of 200 N/mm$^2$ or more from the perspective of providing sufficient strength against bending occurring at the time of insertion or removal of the card edge into or from the connector. The flexural strength is measured by a method complying with JISZ2248.

<Second Embodiment>

Figure 5A:
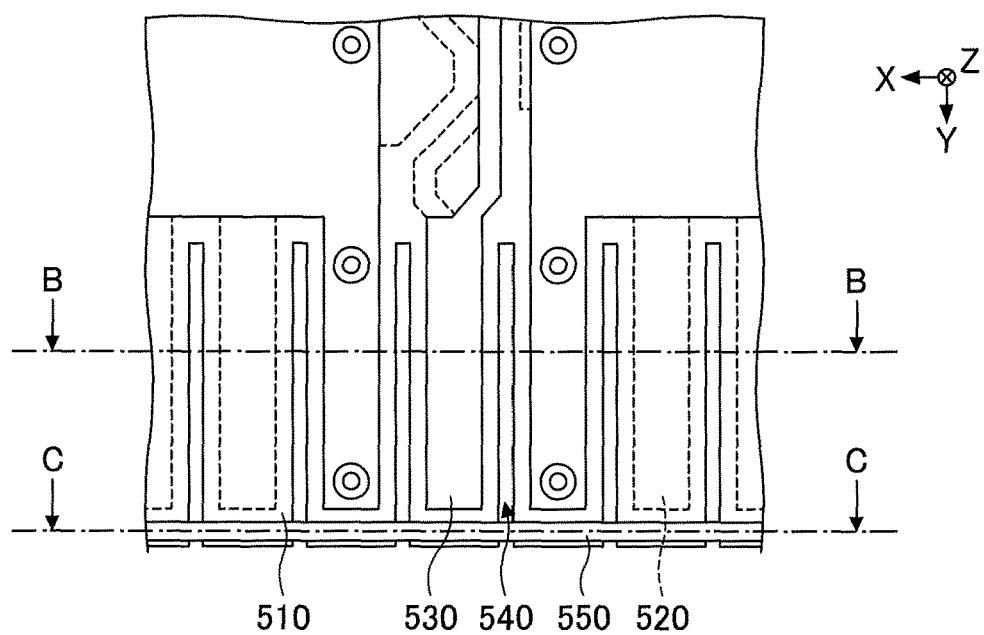
FIGS. 5A through 5C are drawings illustrating a flexible printed circuit board of a second embodiment.
Figure 5B:
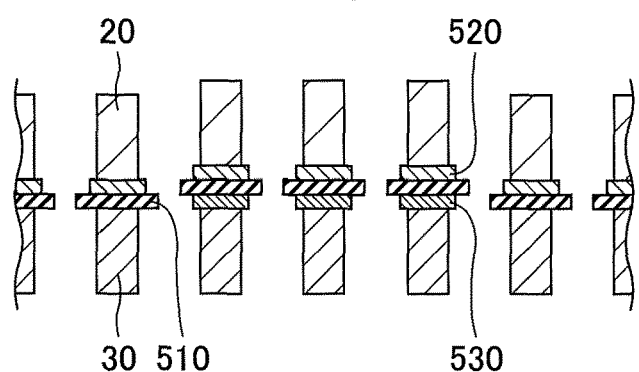
Figure 5C:
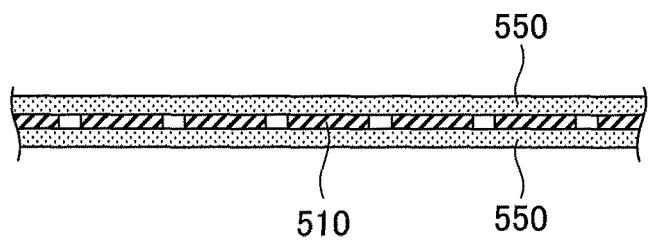

In the following, an FPC of a second embodiment will be described. FIGS. 5A through 5C are drawings illustrating the FPC of the second embodiment. FIG. 5A is a plan view illustrating the back face of the card edge of the FPC. FIG. 5B and FIG. 5C are cross-sectional views taken along the dash and dot line B-B and the dash and dot line C-C, respectively, in FIG. 5A, and illustrate the FPC sandwiched between the upper and lower contacts.

The FPC of the present embodiment has the reinforcement plates 550 bonded to the front face and the back face of the film 510 as illustrated in FIG. 5C. A reinforcement plate 550 may alternatively be provided to cover the tip edge of the film 510.

The remaining configurations are the same as or similar to the configurations of the first embodiment.

As in the first embodiment, the FPC of the present embodiment has the slits 540 between adjacent electrodes of the film 510, which improves the movability of individual electrodes. With this arrangement, the electrodes at the card edge conform to the first contacts 20 and the second contacts 30 even when the thickness of the card edge is uneven or the heights of the second contacts 30 are uneven.

The reinforcement plates 550 situated toward the tip edge of the film 510 than the front face electrodes 520 and the back face electrodes 530 and extending across the slits 540 on the front and back faces of the film 510 ensures that the intervals be maintained between the electrodes. This arrangement prevents the electrodes from being displaced sideways when the card edge is inserted into the connector, and accidental contact between the electrodes is thus prevented.

In this embodiment also, the electrodes are not directly connected to each other through the reinforcement plates 550, so that the individual electrodes conform to the first contacts 20 and the second contacts 30. Accordingly, the electrodes reliably come in contact with the first contacts 20 and the second contacts 30 to improve the reliability of connection between the connector and the FPC.

<Third Embodiment>

Figure 6A:
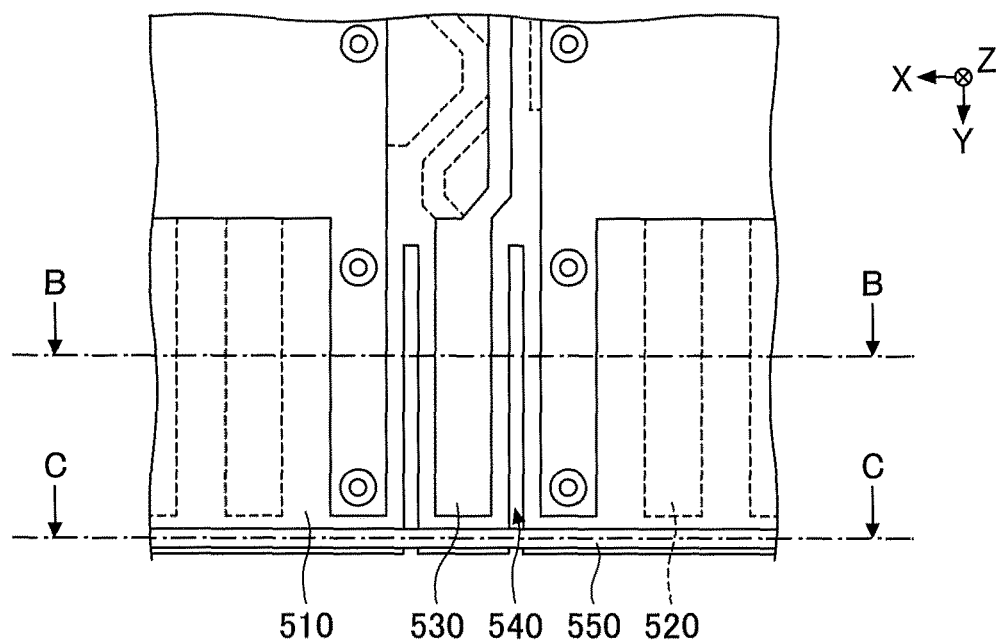
FIGS. 6A through 6C are drawings illustrating a flexible printed circuit board of a third embodiment.
Figure 6B:
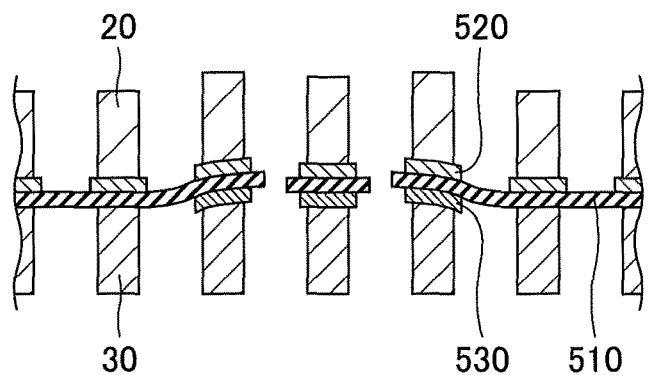
Figure 6C:
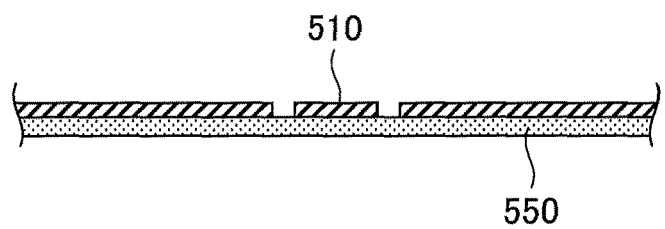

In the following, an FPC of a third embodiment will be described. FIGS. 6A through 6C are drawings illustrating the FPC of the third embodiment. FIG. 6A is a plan view illustrating the back face of the card edge of the FPC. FIG. 6B and FIG. 6C are cross-sectional views taken along the dash and dot line B-B and the dash and dot line C-C, respectively, in FIG. 6A, and illustrate the FPC sandwiched between the contacts of the connector.

The FPC of the present embodiment has the slits 540 only between some of the electrodes. Specifically, the slits 540 in FIGS. 6A through 6C are provided on both sides of the electrode situated at the center, and no other slits are formed between electrodes. The positions at which the slits 540 are provided are not limited to those. It suffices for the slits 540 to be provided at the positions where a contact failure of the electrodes is likely to occur with respect to the first contacts 20 and the second contacts 30.

The remaining configurations are the same as or similar to the configurations of the first embodiment.

The FPC of the present embodiment has the slits 540 between some of the adjacent electrodes, which improve the movability of individual electrodes. With this arrangement, the electrodes conform to the first contacts 20 and the second contacts 30 even when the thickness of the card edge is uneven, for example, thereby ensuring reliable contact between the electrodes and the contacts.

In the present embodiment, although not all the positions between the electrodes are provided with slits, the movability of electrodes is still improved, compared with the case in which no slits are provided. Despite the fact that not all the positions between electrodes are provided with slits, the configuration of the present embodiment serves to improve the reliability of contact with respect to the electrodes.

The reinforcement plates 550 situated toward the tip edge of the film 510 than the front face electrodes 520 and the back face electrodes 530 and extending across the slits 540 at the tip edge of the film 510 ensures that the intervals be maintained between the electrodes. This arrangement prevents the electrodes from being displaced sideways when the card edge is inserted into the connector, and accidental contact between the electrodes is thus prevented.

<Fourth Embodiment>

Figure 7A:
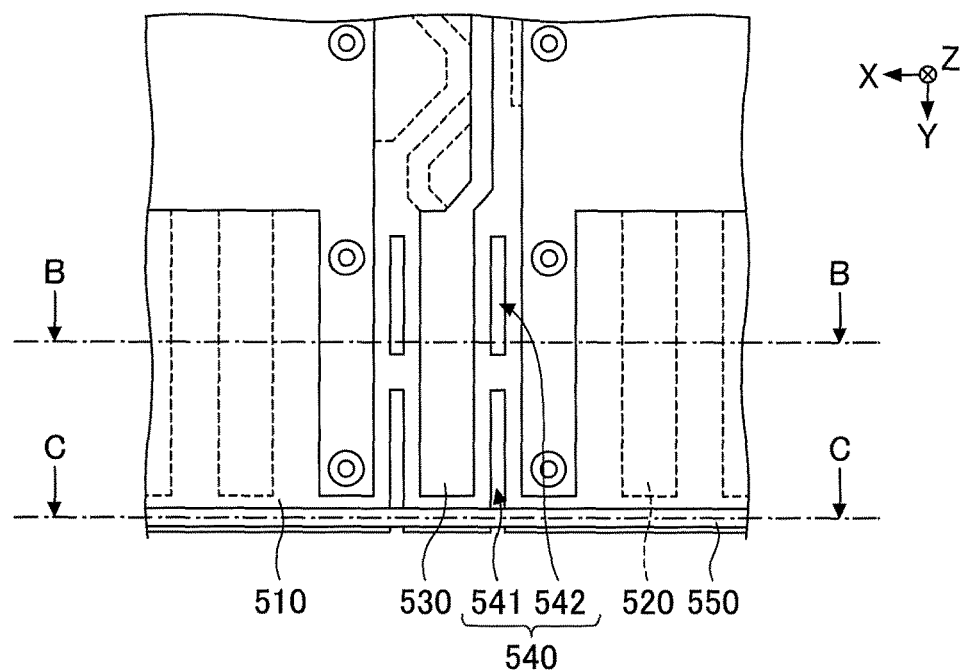
FIGS. 7A through 7C are drawings illustrating a flexible printed circuit board of a fourth embodiment.
Figure 7B:
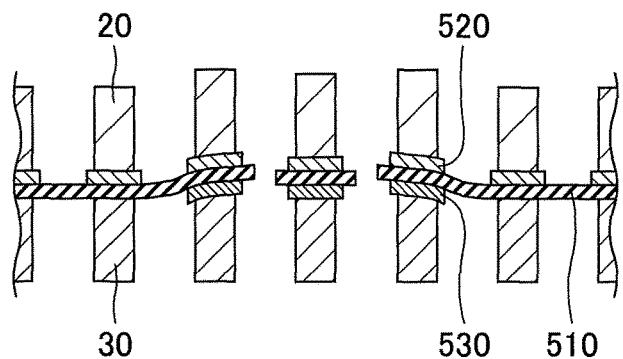
Figure 7C:
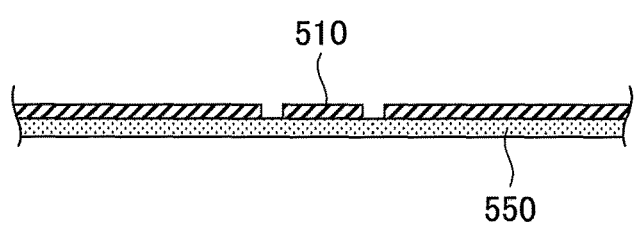

In the following, an FPC of a fourth embodiment will be described. FIGS. 7A through 7C are drawings illustrating the FPC of the fourth embodiment. FIG. 7A is a plan view illustrating the back face of the card edge of the FPC. FIG. 7B and FIG. 7C are cross-sectional views taken along the dash and dot line B-B and the dash and dot line C-C, respectively, in FIG. 7A, and illustrate the FPC sandwiched between the contacts of the connector.

The FPC of the present embodiment has slits that are divided into two or more sections in the longitudinal direction. Specifically, each of the slits 540 in FIG. 7A includes a first slit 541 and a second slit 542. The first slit 541 is situated closer to the tip edge of the film 510 than the second slit 542. The reinforcement plate 550 is disposed to extend across the first slits 541. The number of divided sections of the slits 540 is not limited to two, and may be three or more.

The remaining configurations are the same as or similar to the configurations of the third embodiment.

The FPC of the present embodiment also has the slits 540 between the adjacent electrodes which improves the movability of individual electrodes. Despite the fact that the slits are not continuous, the movability of individual electrodes is improved, which improves the reliability of contact with respect to the first contacts 20 and the second contacts 30.

In addition to the reinforcement plate 550, the electrodes are also connected to each other at the position between the first slit 541 and the second slit 542. This provision also serves to maintain the intervals between the electrodes not only at the terminal end of electrodes but also around the center of electrodes in the longitudinal direction. This arrangement prevents the electrodes from being displaced sideways when the card edge is inserted into the connector, and accidental contact between the electrodes is thus prevented.

<Fifth Embodiment>

Figure 8A:
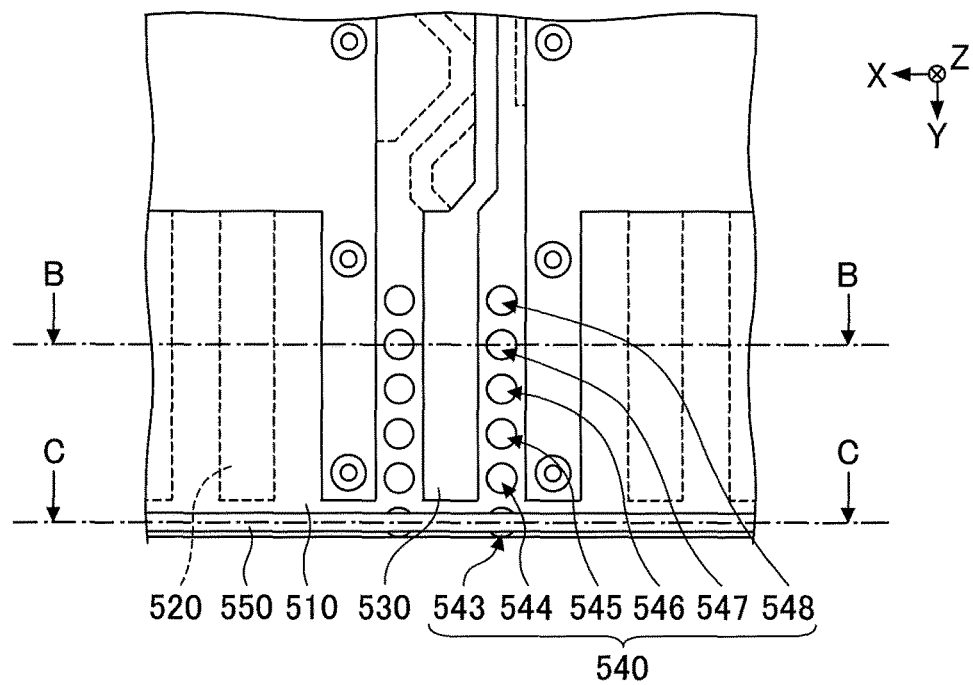
FIGS. 8A through 8C are drawings illustrating a flexible printed circuit board of a fifth embodiment.
Figure 8B:
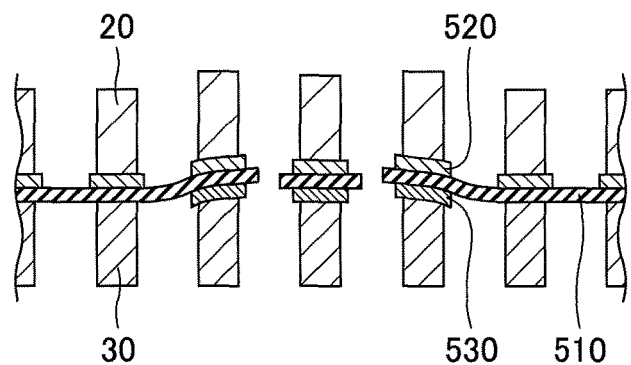
Figure 8C:
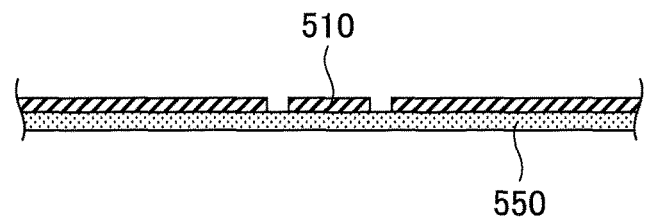

In the following, an FPC of a fifth embodiment will be described. FIGS. 8A through 8C are drawings illustrating the FPC of the fifth embodiment. FIG. 8A is a plan view illustrating the back face of the card edge of the FPC. FIG. 8B and FIG. 8C are cross-sectional views taken along the dash and dot line B-B and the dash and dot line C-C, respectively, in FIG. 8A, and illustrate the FPC sandwiched between the contacts of the connector.

The FPC of the present embodiment has circular holes aligned in the longitudinal direction. Specifically, six circular holes 543, 544, 545, 546, 547, and 548 in FIG. 8A are aligned in the longitudinal direction of the film 510. The reinforcement plate 550 is disposed to extend across the holes 543. It suffices for the diameter of the holes 543 through 548 to be shorter than the distance between adjacent electrodes, and may be 0.05 to 0.1 millimeters. The shape of the holes 543 through 548 is not limited to a circle. The shape may be an ellipse, or may be any other shape. The number of holes 540 is not limited to six.

The remaining configurations are the same as or similar to the configurations of the third embodiment.

The FPC of the present embodiment has holes in place of slits, which can also improve the movability of individual electrodes. With this arrangement, the electrodes conform to the first contacts 20 and the second contacts 30 even when the thickness of the card edge is uneven, thereby ensuring reliable contact.

The reinforcement plate 550 is situated close to the tip edge of the film 510. Also, the adjacent electrodes are connected by the film 510 to each other at the positions other than where the holes are formed, such as at the position between adjacent holes situated next to one another in the vertical direction in FIG. 8A. This arrangement successfully provides the movability of electrodes while maintaining the intervals between the electrodes. In FIGS. 8A through 8C, the hole 543 is in contact with the tip edge of the film 510. Nonetheless, the hole 543 at the bottom in the drawing may alternatively be formed away from the tip edge of the film 510 toward the electrode. This arrangement may prevent the electrodes from losing the predetermined intervals at the tip edge of the film 510 even if the reinforcement plate is absent.

Further, the present invention is not limited to these embodiments, but various variations and modifications may be made without departing from the scope of the present invention.

The present application is based on and claims priority to Japanese priority application No. 2017-188250 filed on Sep. 28, 2017, with the Japanese Patent Office, the entire contents of which are hereby incorporated by reference.

What is claimed is:

1. A flexible printed circuit board for coupling to a connector having a plurality of contacts, comprising:
   a flexible film;
   a plurality of electrodes disposed on at least one face of the film and configured to come in contact with the contacts of the connector;
   one or more slits formed in the film between adjacent electrodes among the plurality of electrodes; and
   a reinforcement plate disposed on at least one face of the film.

2. The flexible printed circuit board as claimed in claim 1, wherein the reinforcement plate is situated closer to a tip edge of the film than are the electrodes.

3. The flexible printed circuit board as claimed in claim 1, wherein the reinforcement plate is made of an insulating material.

4. The flexible printed circuit board as claimed in claim 1, wherein the reinforcement plate is made of a metal material.

5. A flexible printed circuit board for coupling to a connector having a plurality of contacts, comprising:
   a flexible film;
   a plurality of electrodes disposed on at least one face of the film and configured to come in contact with the contacts of the connector; and
   one or more slits formed in the film between adjacent electrodes among the plurality of electrodes that are spaced at equal intervals.

* * * * *